US009379353B2

(12) United States Patent
Hsiao et al.

(10) Patent No.: US 9,379,353 B2
(45) Date of Patent: Jun. 28, 2016

(54) DISPLAY PANEL

(71) Applicant: AU OPTRONICS CORP., Hsin-Chu (TW)

(72) Inventors: Chih-Hung Hsiao, Hsin-Chu (TW); Shih-Feng Hsu, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 97 days.

(21) Appl. No.: 14/459,764

(22) Filed: Aug. 14, 2014

(65) Prior Publication Data

US 2015/0296573 A1  Oct. 15, 2015

(30) Foreign Application Priority Data

Apr. 10, 2014  (TW) .............................. 103113243 A

(51) Int. Cl.
*H01L 51/52* (2006.01)
*H05B 33/22* (2006.01)
*H05B 33/04* (2006.01)

(52) U.S. Cl.
CPC ............ *H01L 51/5246* (2013.01); *H05B 33/04* (2013.01); *H05B 33/22* (2013.01)

(58) Field of Classification Search
CPC ..... H05B 33/04; H05B 33/22; H01L 51/5246
USPC .............. 359/514, 850; 345/76; 313/463, 512
See application file for complete search history.

(56) References Cited

U.S. PATENT DOCUMENTS

| 4,802,873 | A | * | 2/1989 | Barrow | .................. | H05B 33/04 445/24 |
| 6,954,030 | B2 | * | 10/2005 | Kawase | .................. | H01J 17/18 313/495 |
| 7,701,136 | B2 | | 4/2010 | Kwak | | |
| 2005/0248270 | A1 | | 11/2005 | Ghosh et al. | | |
| 2007/0128967 | A1 | * | 6/2007 | Becken | ............... | H01L 51/5237 445/25 |
| 2007/0176550 | A1 | | 8/2007 | Kwan | | |
| 2009/0295687 | A1 | * | 12/2009 | Wang | ...................... | H01J 11/10 345/60 |
| 2010/0245271 | A1 | * | 9/2010 | Park | .................... | H01L 51/5237 345/173 |
| 2012/0026074 | A1 | * | 2/2012 | Lee | ..................... | H01L 27/3276 345/76 |
| 2012/0287026 | A1 | * | 11/2012 | Masuda | .............. | H01L 27/3272 345/76 |
| 2012/0319123 | A1 | | 12/2012 | Han et al. | | |
| 2012/0319574 | A1 | * | 12/2012 | Kim | .................... | H01L 51/5246 313/512 |
| 2012/0326951 | A1 | * | 12/2012 | Yamazaki | ............. | G02F 1/1345 345/76 |
| 2013/0048967 | A1 | * | 2/2013 | Nishido | ................. | H05B 33/04 257/40 |
| 2013/0137200 | A1 | * | 5/2013 | Shimomura | ........ | H01L 33/0095 438/26 |

FOREIGN PATENT DOCUMENTS

TW           200729578           8/2007

\* cited by examiner

*Primary Examiner* — Ricky D Shafer
(74) *Attorney, Agent, or Firm* — WPAT, PC; Justin King

(57) ABSTRACT

A display panel has a display region including a first substrate, a second substrate opposite to the first substrate, a frit layer, a first reflective layer, and a second reflective layer. The frit layer surrounding the display region is disposed between the first substrate and the second substrate. The frit layer includes a first edge adjacent to the display region and a second edge adjacent to the peripheral region. The first reflective layer surrounds the first edge, in which an orthogonal projection direction of the first edge of the frit layer partially overlaps with the first reflective layer. The second reflective layer surrounds the second edge, in which an orthogonal projection direction of the second edge of the frit layer partially overlaps with the second reflective layer, and the first reflective layer and the second reflective layer are disposed opposite to each other on the first substrate.

14 Claims, 8 Drawing Sheets

DISPLAY PANEL

RELATED APPLICATIONS

This application claims priority to Taiwan Application Serial Number 103113243, filed Apr. 10, 2014, which are herein incorporated by reference.

BACKGROUND

An organic light-emitting diode (OLED) is a light-emitting element using luminescent organic compounds. The OLED has a self-luminescent property, and its thinness, display quality, and power saving feature are superior to those of the liquid crystal display (LCD). Because the OLED has features of broad viewing angle, high response speed, and ultra-thinness, the OLED can be applied more widely.

As to the factors affecting the operation life of an OLED device, in addition to the luminescent organic material, inorganic indium tin oxide coating, and metal electrodes, a sealing material for blocking oxygen and moisture is also an important factor. Because the luminescent organic materials and the metal electrode are highly sensitive to oxygen and moisture, dark spots may be generated quickly on an OLED panel without appropriate protection, thus resulting in the attenuation of the light intensity and then the destruction of the entire device.

One encapsulation method is to bond the substrates by using laser to melt the frit glass. When the frit glass is melted by the laser, temperatures in central and edge portions of the frit glass are not uniform, such that only the central portions of the frit glass is completely melted and has a better bonding ability. Though the temperature in the edge portion of the frit glass can be elevated if the intensity of the laser is enhanced, so as to sinter the edge portion of the frit glass completely for enhancing the bonding effect, yet bubbles will be formed in the central portion of the frit glass due to too high temperature, thus worsening the bonding effect. Therefore, the prior art is in a dilemma.

SUMMARY

This disclosure provides a display panel to enhance the bonding strength between a frit layer sintered by laser and a substrate by disposing a reflective layer In one embodiment, a display panel is provided. A display panel has a display region and a peripheral region, in which the peripheral region surrounds the display region. The display panel includes a first substrate, a second substrate, a frit layer, a first reflective layer, and a second reflective layer. The second substrate is opposite to the first substrate. The frit layer is disposed between the first substrate and the second substrate and surrounds the display region, in which the frit layer includes a first edge and a second edge, the first edge is adjacent to the display region, and the second edge is adjacent to the peripheral region. The first reflective layer surrounds the first edge, in which the first edge of the frit layer partially overlaps with the first reflective layer in an orthogonal projection direction. The second reflective layer surrounds the second edge, in which the second edge of the frit layer partially overlaps with the second reflective layer in an orthogonal projection direction, and the first reflective layer and the second reflective layer are disposed opposite to each other and on the first substrate.

In one or more embodiments, the display panel further includes a passivation layer disposed between the first substrate and the frit layer.

In one or more embodiments, the passivation layer is disposed on the first substrate, and the passivation layer does not cover the first reflective layer and the second reflective layer, and the frit layer directly contacts the passivation layer, a portion of the first reflective layer, and a portion of the second reflective layer.

In one or more embodiments, the passivation layer is disposed on the first substrate, and the passivation layer entirely covers the first reflective layer and the second reflective layer, and the frit layer directly contacts only the passivation layer.

In one or more embodiments, the passivation layer is partially disposed on the first substrate, the passivation layer entirely covers the first reflective layer and the second reflective layer, and the frit layer directly contacts a portion of the passivation layer and a portion of the first substrate.

In one or more embodiments, the peripheral region further includes a plurality of peripheral circuits disposed on the first substrate.

In one or more embodiments, the peripheral region further includes a dielectric layer covering the peripheral circuits, and the dielectric layer is disposed between the peripheral circuits, the first reflective layer, and the second reflective layer.

In one or more embodiments, the first reflective layer and the second reflective layer do not overlap with the peripheral circuits in an orthogonal projection direction.

In one or more embodiments, materials of the first reflective layer and the second reflective layer include molybdenum, aluminum, titanium, silver, or a stack structure of the aforementioned materials.

In one or more embodiments, a thickness of the first reflective layer or the second reflective layer is substantially from 100 to 6000 angstroms (Å).

In one or more embodiments, a thickness of the first reflective layer or the second reflective layer is about substantially from 100 to 300 angstroms (Å).

In one or more embodiments, a thickness of the first reflective layer or the second reflective layer is substantially from 1000 to 6000 angstroms (Å).

In one or more embodiments, a material of the frit layer includes magnesium oxide, calcium oxide, lead oxide, tin oxide, titanium oxide, lead oxide, silicon dioxide, bismuth oxide, iron oxide, aluminum oxide, vanadium pentoxide, boron pentoxide, lead borate glass, tin phosphate glass, vanadate glass, borosilicate glass, or a mixture of the aforementioned materials.

In one or more embodiments, the first substrate is a display element substrate, and the second substrate is a color filter substrate or a cover glass.

By disposing the first reflective layer and the second reflective layer on both sides of the frit layer, the laser emitted on both sides of the frit layer is reflected when the frit layer is melt to bond the first substrate and the second substrate, such that the laser melts the frit layer twice to elevate the temperatures of both sides of the sintered frit layer to make the overall temperature of the frit layer uniform, thus enhancing the overall bonding ability of the sintered frit layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
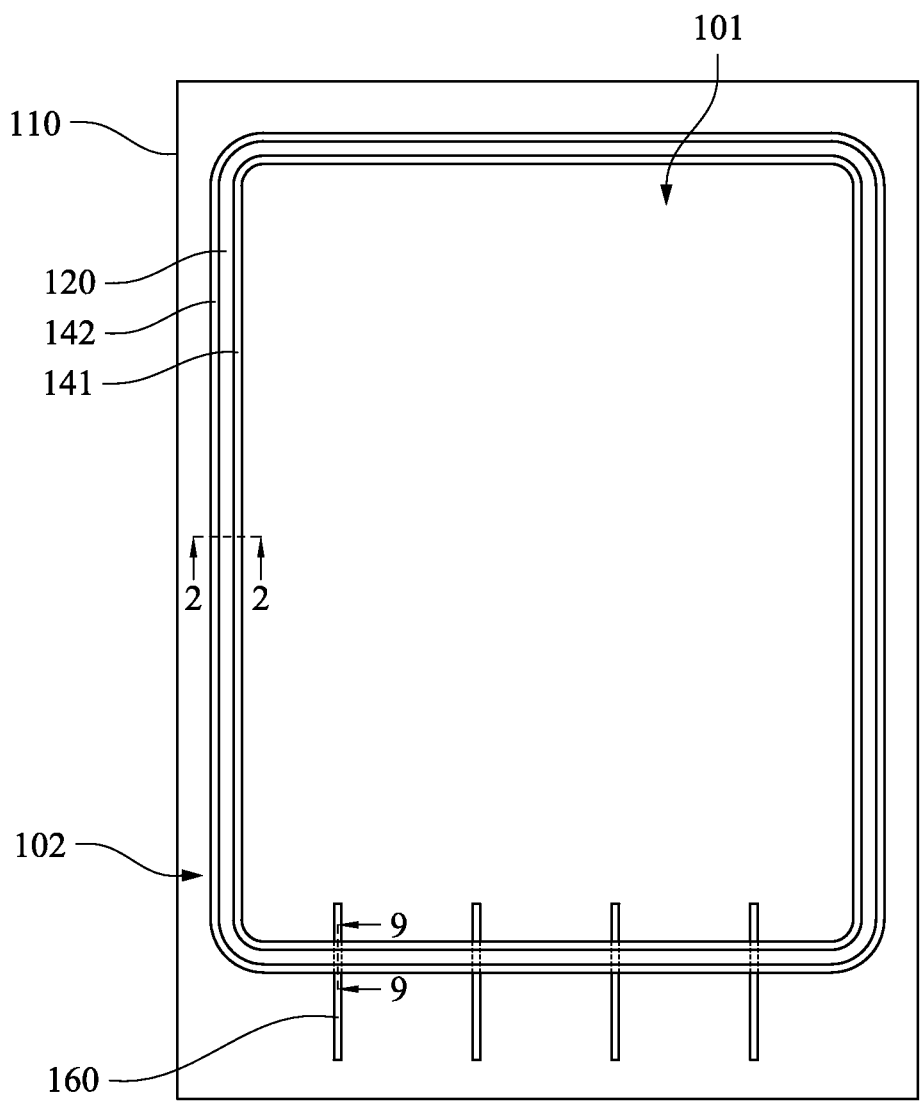
FIG. 1 is a top view of a display panel according to one embodiment of this invention.
Figure 2:
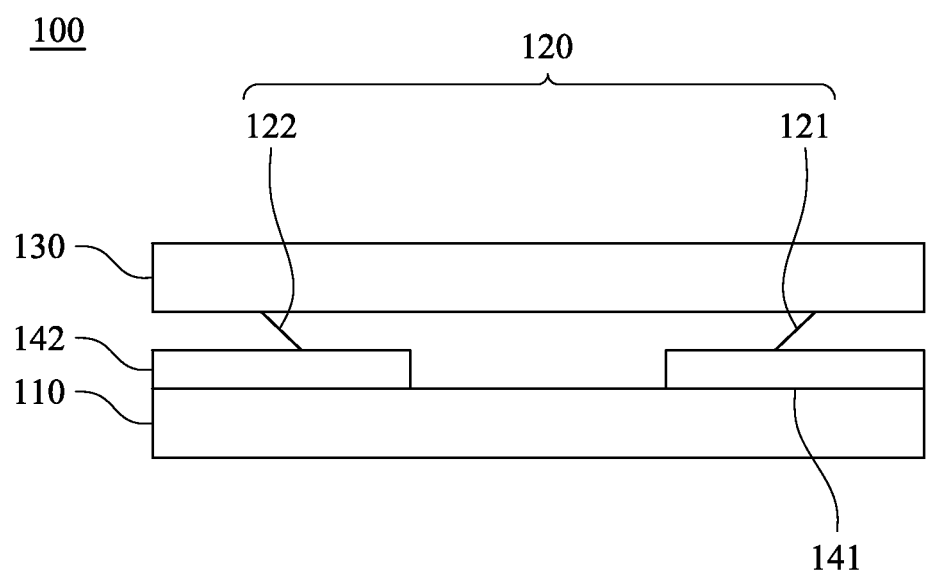
FIG. 2 is a cross-sectional view along with the line 2 of FIG. 1.

FIG. 1 is a top view of a display panel 100 according to one embodiment of this invention. FIG. 2 is a cross-sectional view along with the line 2 of FIG. 1. As shown in FIG. 1 and FIG. 2, a display panel 100 is provided. The display panel 100 is mainly used as a display panel of the organic light emitting diode (OLED) and a frit glass which is melted by laser for bonding and packaging respective substrates, according to various embodiments of this invention.

The display panel 100 has a display region 101 and a peripheral region 102, in which the peripheral region 102 surrounds the display region 101. The display panel 100 includes a first substrate 110, a second substrate 130, a frit layer 120, a first reflective layer 141, and a second reflective layer 142. The second substrate 130 is opposite to the first substrate 110. The frit layer 120 surrounding the display region 101 is disposed between the first substrate 110 and the second substrate 130. The frit layer 120 includes a first edge 121 and a second edge 122. The first edge 121 is adjacent to the display region 101, and the second edge 122 is adjacent to the peripheral region 102. The first reflective layer 141 surrounds the first edge 121, in which an orthogonal projection direction of the first edge 121 of the frit layer 120 partially overlaps with the first reflective layer 141. The second reflective layer 142 surrounds the second edge 122, in which an orthogonal projection direction of the second edge 122 of the frit layer 120 partially overlaps with the second reflective layer 142, and the first reflective layer 141 and the second reflective layer 142 are disposed opposite to each other on the first substrate 110. In the embodiment, the peripheral region 102 further includes a plurality of peripheral circuits 160 disposed on the first substrate 110. The peripheral circuits 160 are electrically connected to the display elements in the display region 101.

In the embodiment, a thickness of the first reflective layer 141 or the second reflective layer 142 can be from about 100 to about 6000 angstroms (Å). If the thickness of the first reflective layer 141 or the second reflective layer 142 is smaller than 100 Å, a uniform layer is difficult to be formed due to the manufacturing process, such that the reflectivity of the reflective layer is lowered. And, if the thickness of the first reflective layer 141 or the second reflective layer 142 is greater than 6000 Å, the internal stress will be too large due to the thicker reflective layer to generate hillocks, thus causing the first reflective layer 141 and the second reflective layer to be un-uniform and reducing the reflectivity of the reflective layer. Therefore, when the thickness of the first reflective layer 141 or the second reflective layer is from about 100 to about 6000 Å, the first reflective layer 141 or the second reflective layer 142 has a better reflectivity.

In the embodiment, the first reflective layer 141 and the second reflective layer 142 can be formed with the display region 101 of the metal layer in the same process to simplify the manufacturing processes and lower the cost. And, the thickness of the first reflective layer 141 and the second reflective layer 142 may be decided by a thickness of the metal layer in the display region 101. For example, the thickness of the metal layer of thin film transistor is from about 1000 to about 2000 Å. Because the metal layer may be a three-stacked-layer structure, the overall thickness of the metal layer may attain to 6000 Å. In another embodiment, the thickness of the first reflective layer 141 or the second reflective layer is from about 100 to about 300 Å. For example, the thickness of the metal layer of electrodes is from about 100 to about 300 Å in a common OLED display panel.

In the embodiment, the material of the first reflective layer 141 or the second reflective layer 142 can be molybdenum, aluminum, titanium, silver, or a stack structure of the aforementioned materials, but not limited thereto. People having ordinary skill in the art can make proper modification to the material of the first reflective layer 141 and the second reflective layer 142 according to their actual requirements.

In the embodiments, a material of the frit layer 120 can be magnesium oxide, calcium oxide, lead oxide, tin oxide, titanium oxide, lead oxide, silicon dioxide, bismuth oxide, iron oxide, aluminum oxide, vanadium pentoxide, boron pentoxide, lead borate glass, tin phosphate glass, vanadate glass, borosilicate glass, or a mixture of the aforementioned materials, but not limited thereto. People having ordinary skill in the art can make proper modification according to their actual requirements.

In the embodiment, the first substrate 110 may be a display element substrate, and the second substrate 130 may be a color filter substrate or a cover glass, but not limited thereto. People having ordinary skill in the art can make proper modification to the material of the first substrate 110 and the second substrate 130 according to their actual requirements.

As shown in FIG. 2, the first edge 121 and the second edge 122 constitute a bevel structure with the second substrate 130. Because the frit layer 120 is dispensed or printed on the second substrate 130, the molecular cohesion of the frit layer 120 inwardly pulls a portion of the frit layer 120 away from the second substrate 130 (the frit layer 120 is colloidal at this time) to form the bevel structure. Therefore, the angle between the first edge 121, the second edge 122 and the second substrate 130 is not to limit the disclosure.

Figure 3A:
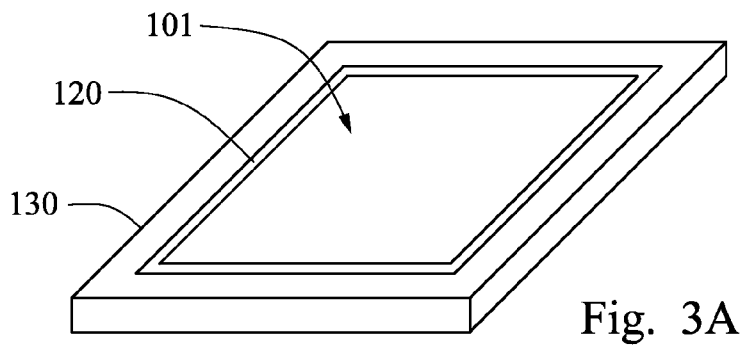
FIGS. 3A to 3C are perspective views of the display panel in various assembling steps according to one embodiment of this invention.
Figure 3B:
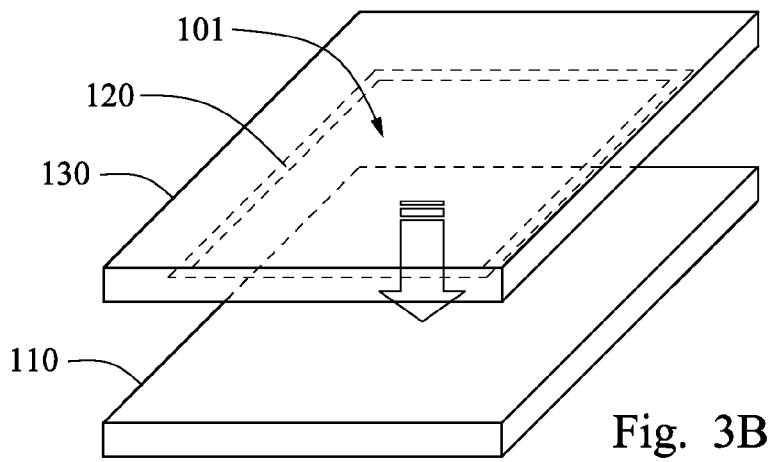
Figure 3C:
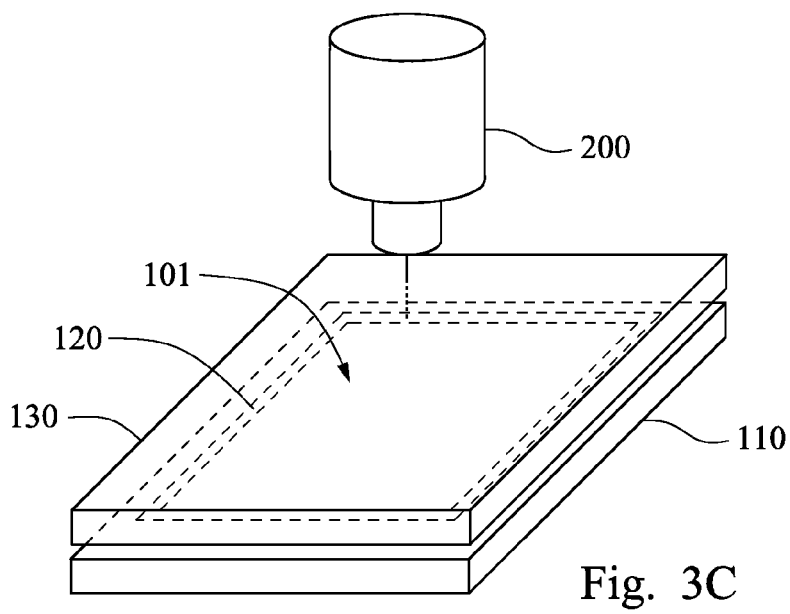

FIGS. 3A to 3C are perspective views of the display panel 100 in various assembling steps according to one embodiment of this invention. As shown in FIG. 3A to 3C, in order to isolate elements in the display region 101 for blocking oxygen and moisture from the ambience, the following packaging steps are generally performed. As shown in FIG. 3A, the second substrate 130 is provided at first, and then the frit layer 120 is disposed on the second substrate 130 by coating or printing, in which the frit layer 120 surrounds the display region 101. As shown in FIG. 3B, the second substrate 130 is turned upside down, and then the second substrate 130 and the first substrate 110 are aligned with each other for encapsulation. Then, as shown in FIG. 3C, a laser device 200 is used to emit laser from the above of the second substrate 130 through the second substrate 130 to melt the frit layer 120, such that the frit layer 120 bonds the first substrate 110 and the second substrate 130 by laser sintering, thereby isolating the display elements in the display region 101 from the ambience to achieve the packaging effect of blocking oxygen and moisture.

Figure 4A:
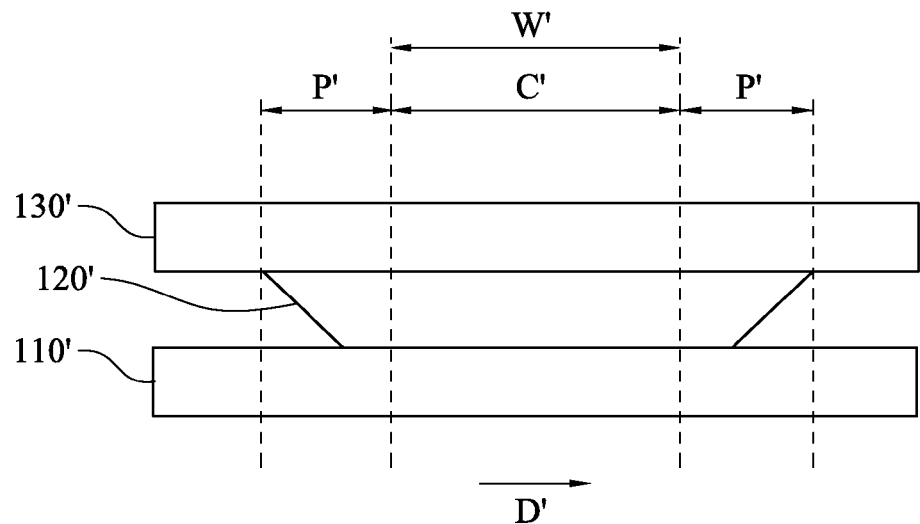
FIG. 4A is a cross-sectional view of a conventional display panel.
Figure 4B:
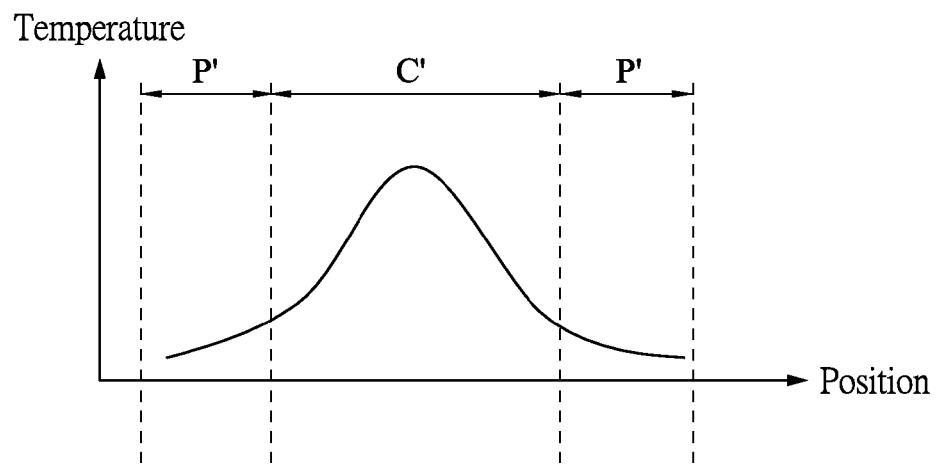
FIG. 4B is a position versus temperature graph when a frit layer of FIG. 4A is being melted.

FIG. 4A is a cross-sectional view of a conventional display panel. FIG. 4B is a position versus temperature graph when a frit layer 120' of FIG. 4A is being melted. As shown in FIG. 4A, the laser is emitted from the above of the second substrate 130' by the laser device to melt the frit layer 120' after passing through the second substrate 130'. A position versus temperature graph of the frit layer 120' is as shown in FIG. 4B, in which a position axis represents the position of a portion of the frit layer 120' along a direction D'. A temperature at a center region C' of the frit layer 120' is much higher than a temperature at a peripheral region P' of the frit layer 120'. Therefore, the center region C' has a better bonding ability due to sinter completely. Thus, the center region C' has a better adhesion effect, that is possessing a better tensile ability and forms a complete reaction region with a width W'. However, because the temperature of the peripheral region P' is not high enough, the reaction is not complete, and the bonding ability of the peripheral region P' is poor. If the laser intensity is enhanced, the temperature of the entire frit layer 120' is elevated. Then, though the peripheral region P' has a better bonding ability due to the complete sintering by the elevated temperature, the center region C' is overheated, and bubbles are formed in the center region C', such that the center region C' accepting bending ability is decreased.

Figure 5A:
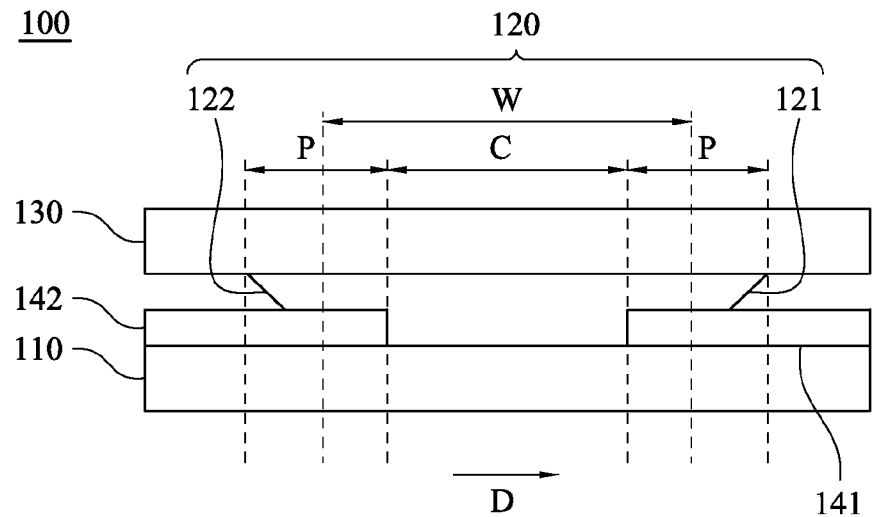
FIG. 5A is cross-sectional view along with the line 2 of FIG. 1 according to one embodiment of this invention.
Figure 5B:
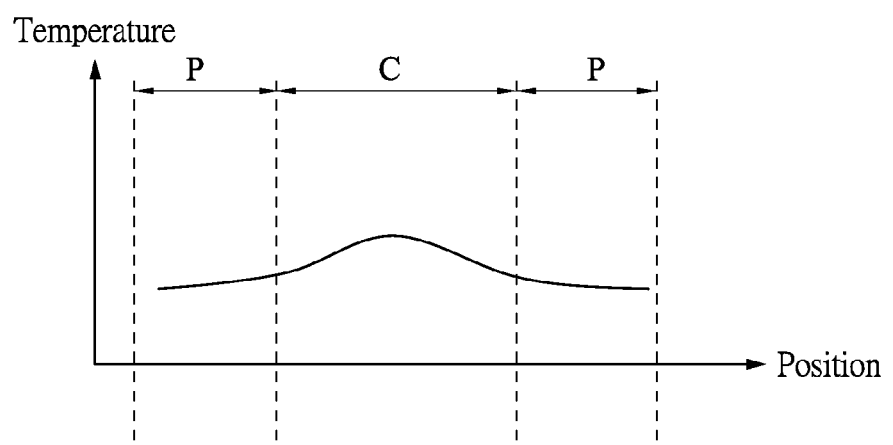
FIG. 5B is a position versus temperature graph when the frit layer of FIG. 5A is being melted.

FIG. 5A is cross-sectional view along with the line 2 of FIG. 1 according to one embodiment of this invention. FIG. 5B is a position versus temperature graph when the frit layer 120 of FIG. 5A is being melted. As shown in FIG. 5A, the laser is emitted from the above of the second substrate 130 by the laser device to melt the frit layer after passing through the second substrate 130, the laser passing a peripheral region P of the frit layer 120 is reflected by the first reflective layer 141 and the second reflective layer 142. Thus the peripheral region P is melted twice by the laser and the reflected laser, and a temperature of the peripheral region P is elevated. A position versus temperature graph is as shown in FIG. 5, in which a position axis represents a position of a portion of the frit layer 120 along a direction D. Compared with the conventional display panel of FIG. 4A, the temperature distribution of the frit layer 120 from a center region C to the peripheral region P becomes more uniform. The frit layer 120 forms the complete reaction region with a width W, in which the complete reaction region includes the center region C and a portion of the peripheral region P, and the width W is greater than the width W' of FIG. 4A. Therefore, compared with the conventional display panel, the frit layer 120 has a better adhesion effect, that is possessing a better tensile ability. Meanwhile, bubbles are not formed in the frit layer 120 due to the appropriate temperature, so that the accepting bending ability of the frit layer 120 is decreased.

Figure 6:
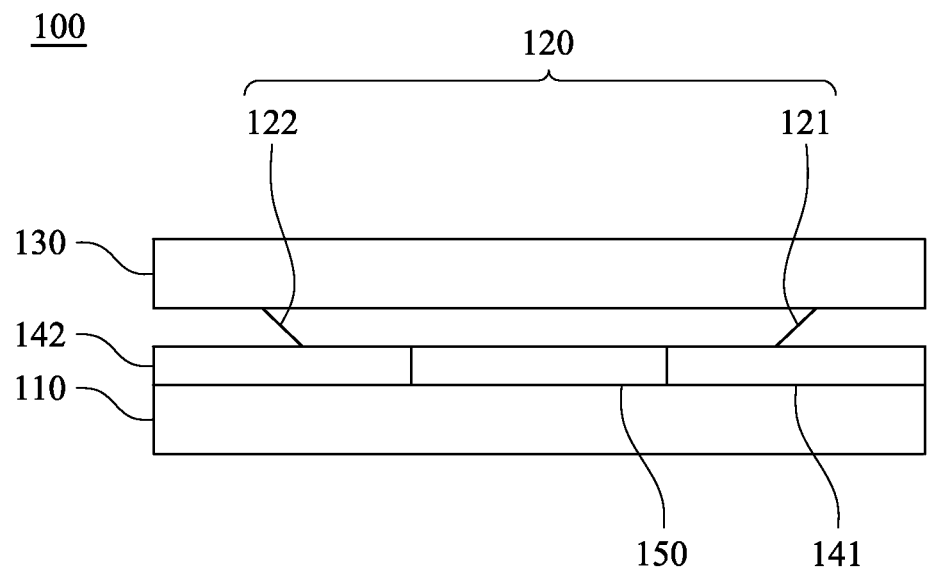
FIGS. 6 to 8 are cross-sectional views along with the line 2 of FIG. 1 according to various embodiments of this invention.
Figure 7:
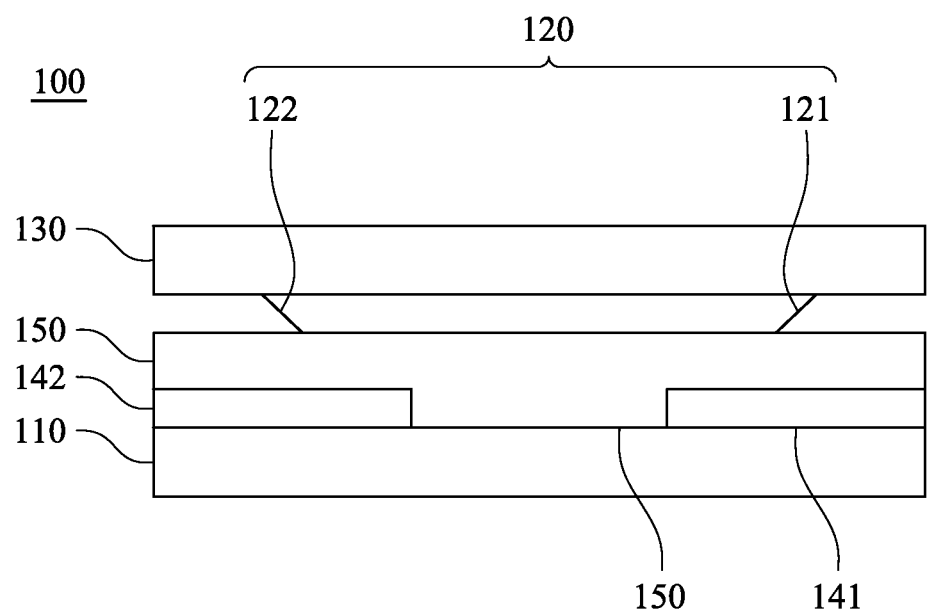
Figure 8:
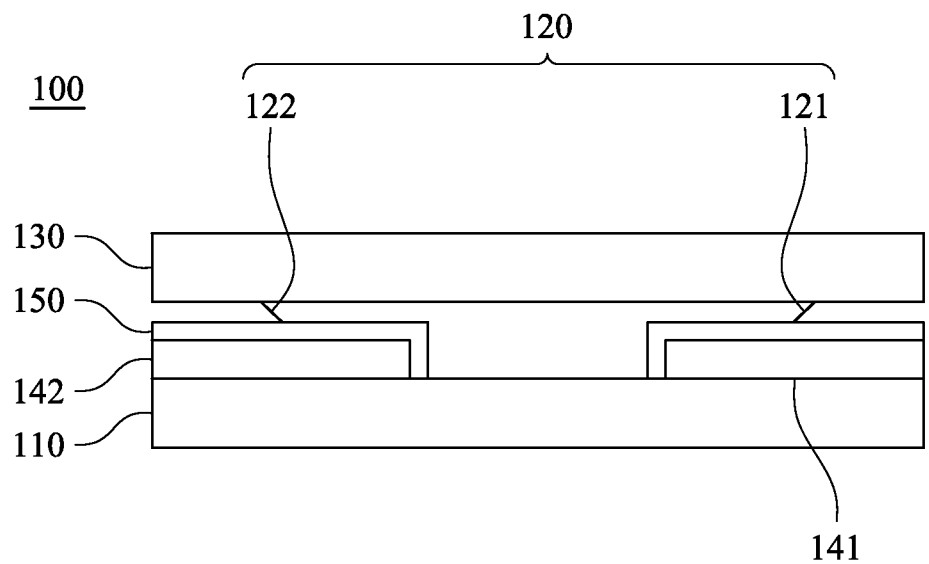

FIGS. 6 to 8 are cross-sectional views along with the line 2 of FIG. 1 according to various embodiments of this invention. As shown in FIG. 6 to FIG. 8, the display panel 100 further including a passivation layer 150 disposed between the first substrate 110 and the frit layer 120. In the embodiment, a material of the passivation layer 150 may be silicon nitride, silicon dioxide, silicon oxynitride, or a mixture of the aforementioned materials, but not limited thereto. People having ordinary skill in the art can make proper modification to the material of the passivation layer 150 according to their actual needs. The passivation layer 150 has a protective ability to isolate the first reflective layer 141 and the second reflective layer 142 from the ambience, so as to prevent the first reflective layer 141 and the second reflective layer 142 from being oxidized due to the reaction with ambient oxygen and moisture. Due to the material characteristics of the frit layer 120 are different. The bonding strength of the frit layer 120 and the first reflective layer 141 and the bonding strength of the second reflective layer 142 and the first substrate 110 may be decreased. Therefore, the bonding strength of the frit layer 120 and the first reflective layer 141 and the bonding strength of the second reflective layer 142 and the first substrate 110 may be enhanced by disposing the passivation layer 150. In FIGS. 6 to 8, only the passivation layer 150 around the frit layer 120 is shown. In fact, the passivation layer 150 may cover the first substrate 110 entirely. The position of the passivation layer 150 can be adjusted by the design of the manufacturing processes.

As shown in FIG. 6, the passivation layer 150 is disposed on the first substrate 110. The passivation layer 150 does not cover the first reflective layer 141 and the second reflective layer 142, and the frit layer 141 directly contacts the passivation layer 150, a portion of the first reflective layer 141 and a portion of the second reflective layer 142. Therefore, the passivation layer 150 has the protection ability and enhances the bonding strength ability. Specifically, when the bonding strength between the frit layer 120 and the first substrate 110 is weaker, the embodiment can be adopted to enhance the overall bonding effect of the display panel 100.

As shown in FIG. 7, the passivation layer 150 is disposed on the first substrate 110. The passivation layer 150 covers the first reflective layer 141 and the second reflective layer 142 entirely, and the frit layer 120 directly contacts only the passivation layer 150. Therefore, the passivation layer 150 has the protection ability and enhances the bonding strength ability. Specifically, when the bonding strength of the frit layer 120 and the first substrate 110 and the bonding strength of the first reflective layer 141 and the second reflective layer 142 is weaker, the embodiment can be adopted to enhance the overall bonding effect of the display panel 100.

As shown in FIG. 8, the passivation layer 150 is partially disposed on the first substrate 110, the passivation layer 150 covers the first reflective layer 141 and the second reflective layer 142 entirely, and the frit layer 120 directly contacts a portion of the passivation layer 150 and a portion of the first substrate 110. Therefore, the passivation layer 150 has the protection ability and enhances the bonding strength ability. Specifically, when the bonding strength of the frit layer 120 and the bonding strength of the first reflective layer 141 and the second reflective layer 142 is weaker, the embodiment can be adopted to enhance the overall bonding effect of the display panel 100.

Figure 9:
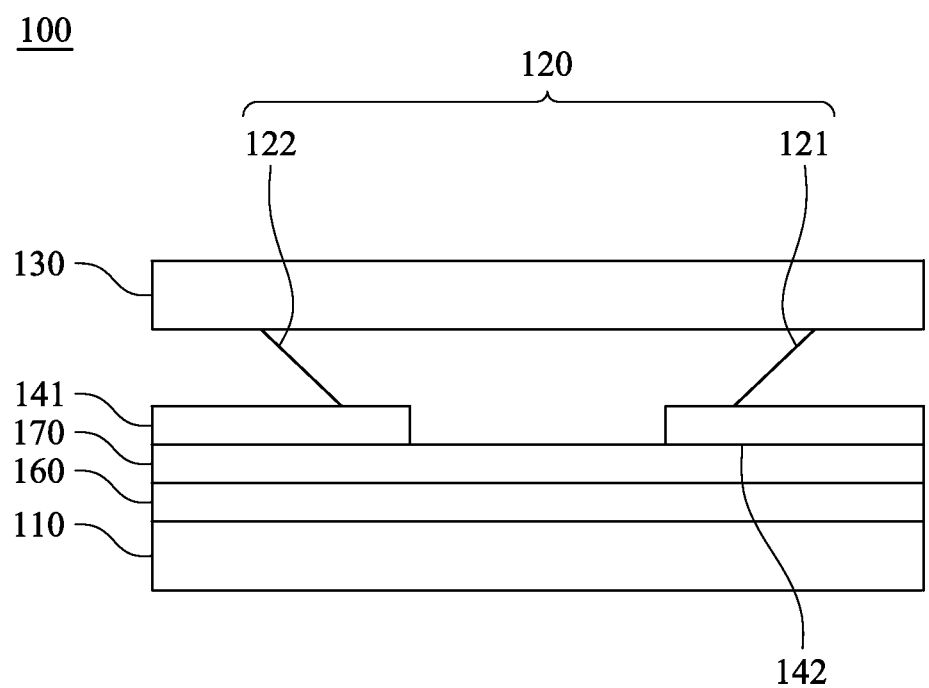
FIG. 9 is a cross-sectional view along with the line 9 of FIG. 1.

FIG. 9 is a cross-sectional view along with the line 9 of FIG. 1. As shown in FIG. 1 and FIG. 9, the peripheral circuits 160 are disposed on the first substrate 110, and the peripheral circuits 160 overlap with the first reflective layer 141 and the second reflective layer 142 in an orthogonal projection direction. In the embodiment, the peripheral region 102 further includes a dielectric layer 170 covering the peripheral circuits 160, and the dielectric layer 170 is disposed between the peripheral circuits 160, the first reflective layer 141 and the second reflective layer 142. Therefore, the peripheral circuits 160 is electrically isolated from the first reflective layer 141 and the second reflective layer via the dielectric layer 170, so that the peripheral circuits 160 does not contact the first reflective layer 141 and the second reflective layer 142, thereby avoiding a short circuit.

Figure 10:
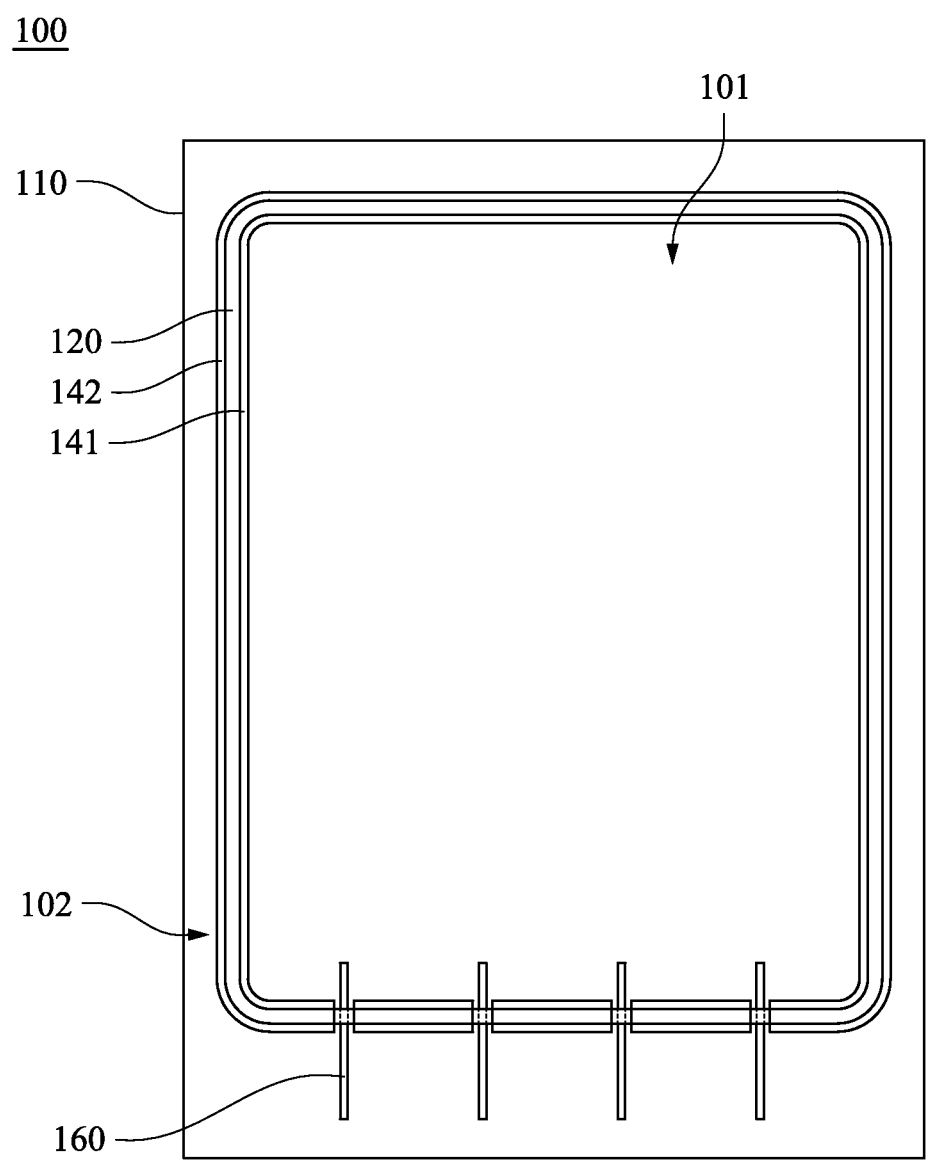
FIG. 10 is a top view of a display panel according to another embodiment of this invention.

FIG. 10 is a top view of the display panel 100 according to another embodiment of this invention. As shown in FIG. 10, the difference between the embodiment of FIG. 10 and the embodiment of FIG. 1 is that the peripheral circuits 160 do not overlap with the first reflective layer 141 and the reflective layer 142 in an orthogonal projection direction. Therefore, the problem of electrostatic discharge, crosstalk phenomenon, additional parasitic capacitance, etc., can be avoided.

By disposing the first reflective layer 141 and the second reflective layer 142 on both sides of the frit layer 120, the laser emitted on both sides of the frit layer 120 is reflected when the frit layer 120 is melted to bond the first substrate 110 and the second substrate 130. Therefore, the laser melts the frit layer 120 twice, such that the temperature of both sides of the frit layer 120 are elevated and the overall temperature of the frit layer 120 is uniform. Thus, the overall bonding ability of the frit layer 120 is enhanced.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A display panel having a display region and a peripheral region, wherein the peripheral region surrounds the display region, the display panel comprising:
   a first substrate;
   a second substrate opposite to the first substrate;
   a frit layer disposed between the first substrate and the second substrate and surrounding the display region, the frit layer comprising a first edge and a second edge, wherein the first edge is adjacent to the display region, and the second edge is adjacent to the peripheral region;
   a first reflective layer surrounding the first edge, wherein the first edge of the frit layer partially overlaps with the first reflective layer in an orthogonal projection direction; and
   a second reflective layer surrounding the second edge, wherein the second edge of the frit layer partially overlaps with the second reflective layer in an orthogonal projection direction, and the first reflective layer and the second reflective layer are disposed opposite to each other and on the first substrate.

2. The display panel of claim 1, further comprising a passivation layer disposed between the first substrate and the frit layer.

3. The display panel of claim 2, wherein the passivation layer is disposed on the first substrate, the passivation layer does not cover the first reflective layer and the second reflective layer, and the frit layer directly contacts the passivation layer, a portion of the first reflective layer and a portion of the second reflective layer.

4. The display panel of claim 2, wherein the passivation layer is disposed on the first substrate, the passivation layer entirely covers the first reflective layer and the second reflective layer, and the frit layer directly contacts only the passivation layer.

5. The display panel of claim 2, wherein the passivation layer is partially disposed on the first substrate, the passivation layer entirely covers the first reflective layer and the second reflective layer, and the frit layer directly contacts a portion of the passivation layer and a portion of the first substrate.

6. The display panel of claim 1, wherein the peripheral region further comprises a plurality of peripheral circuits disposed on the first substrate.

7. The display panel of claim 6, wherein the peripheral region further comprises a dielectric layer covering the peripheral circuits, and the dielectric layer is disposed between the peripheral circuits, the first reflective layer and the second reflective layer.

8. The display panel of claim 6, wherein the first reflective layer and the second reflective layer do not overlap with the peripheral circuits in an orthogonal projection direction.

9. The display panel of claim 1, wherein materials of the first reflective layer and the second reflective layer comprise molybdenum, aluminum, titanium, silver, or a stack structure of the aforementioned materials.

10. The display panel of claim 1, wherein a thickness of the first reflective layer or the second reflective layer is substantially from 100 to 6000 angstroms (Å).

11. The display panel of claim 10, wherein a thickness of the first reflective layer or the second reflective layer is substantially from 100 to 300 angstroms (Å).

12. The display panel of claim 10, wherein a thickness of the first reflective layer or the second reflective layer is substantially from 1000 to 6000 angstroms (Å).

13. The display panel of claim 1, wherein a material of the frit layer comprises magnesium oxide, calcium oxide, lead oxide, tin oxide, titanium oxide, lead oxide, silicon dioxide, bismuth oxide, iron oxide, aluminum oxide, vanadium pentoxide, boron pentoxide, lead borate glass, tin phosphate glass, vanadate glass, borosilicate glass, or a mixture of the aforementioned materials.

14. The display panel of claim 1, wherein the first substrate is a display element substrate, and the second substrate is a color filter substrate or a cover glass.

* * * * *